United States Patent [19]
Guyot et al.

[11] 3,976,947
[45] Aug. 24, 1976

[54] METHOD AND CIRCUIT ARRANGEMENT FOR PRODUCING ELECTRICAL REFERENCE PULSES

[75] Inventors: Volker Guyot, Klein-Gerau; Paul Holdinghausen; Martin Mueller, both of Bickenbach, all of Germany

[73] Assignee: Carl Schenck AG, Darmstadt, Germany

[22] Filed: Sept. 16, 1974

[21] Appl. No.: 506,108

Related U.S. Application Data

[62] Division of Ser. No. 250,727, May 5, 1972, Pat. No. 3,852,673.

[30] Foreign Application Priority Data
May 10, 1971  Germany............................ 2122967

[52] U.S. Cl................................ 328/108; 307/232; 307/234; 328/109; 328/114; 328/111
[51] Int. Cl.²...................... H03K 5/153; H03K 5/20
[58] Field of Search............ 307/235 R, 235 A, 232, 307/234; 324/181, 102, 103 P; 328/1, 2, 5, 108, 109–112, 114, 115–117, 127

[56] References Cited
UNITED STATES PATENTS

| | | | |
|---|---|---|---|
| 3,345,575 | 10/1967 | Van Der Lans | 307/234 X |
| 3,363,187 | 1/1968 | Hickin | 328/108 |
| 3,461,389 | 8/1969 | Whalen | 328/109 |
| 3,568,060 | 3/1971 | Howells | 328/108 X |

Primary Examiner—John Zazworsky
Attorney, Agent, or Firm—W. G. Fasse; W. W. Roberts

[57] ABSTRACT

The present circuit arrangement is, for example, useful for producing reference signals in response to the rotation of a body such as a wheel or rotor to be balanced. Source signals are produced in response to the rotation of said body. Circuit means are provided for handling and comparing the source signals in such a manner that the reference signals are provided at an output terminal in response to the occurrence of the center of a source signal or in response to the maximum of a source signal. The production of pulses may also be controlled in response to (i.e., at) the center and the maximum of a source signal.

5 Claims, 10 Drawing Figures

METHOD AND CIRCUIT ARRANGEMENT FOR PRODUCING ELECTRICAL REFERENCE PULSES

This application is a divisional application of Ser. No. 250,727 filed May 5, 1972, now U.S. Pat. No. 3,852,673 granted Dec. 3, 1974.

BACKGROUND OF THE INVENTION:

The invention relates to a method and to circuit arrangements for producing electrical reference plus signals. The invention is especially useful for determining the angular position of an imbalance of a rotating body relative to the rotation of such bodies which are provided with a marker whereby the rotation of the marker is sensed without any reactive or feedback effect.

German Patent GBP No. 1,103,637 describes a method for producing reference pulses for determining the angular position of an imbalance whereby a marker is sensed by photoelectric or electromagnetic means for generating a spike or needle shaped pulse.

It is the purpose of this prior art to produce rectangular voltage wave forms which have an exact pulse shape and which are substantially free of harmonic waves.

Another German Patent DBP No. 1,103,639 also describes the production of reference pulses by sensing a relatively narrow marker on a rotating body whereby such reference pulses permit the measuring of the angular position of the imbalancing mass.

It is a drawback of the known method and devices for producing electrical reference pulses that the accuracy of the produced pulses depends upon the accuracy with which the marker to be sensed is attached to rotating bodies of the same or of different types. Further, the known methods and devices are useful only for narrow markers to be sensed. In addition, there is no possibility in prior art methods and devices to ascertain and remove errors which, for example, may occur due to the aging of the photocells and which necessarily cause a change in the resolution of the pulses and thus in the accuracy of the reference signals.

OBJECTS OF THE INVENTION

In view of the foregoing, it is the aim of the invention to achieve the following objects singly or in combination:

to overcome the drawbacks of the prior art, especially to provide a method and circuit arrangement which will operate even in response to the sensing of relatively wide markers;

to generate reference pulses independently of the arrangement of a marker to be sensed, especially the accuracy of its positioning;

the reference signals are also to be produced independently of the photoelectric or electromagnetic means which are used for the scanning of the marker so that the sharpness or crispness of the marker will not influence the resulting reference signals;

to produce or control the production of the reference signals at the center of a source pulse or signal resulting from the scanning of said markers;

to produce or control the production of the reference signals at the occurrence of a maximum of the source signals resulting from the scanning of the markers;

to provide a method and circuit arrangement for controlling the production of reference pulses in response to the occurrence of the center and of the maximum of a source pulse, for example, a pulse generated by the rotation of a body to be balanced;

to produce the reference pulses free of interfering signals or pulses which will meet the requirements for balancing techniques, especially with regard to the reproducibility of measured results;

to provide a method and apparatus for sensing even very broad markers or markers which may be sensed only in a tangential manner relative to the rotating body carrying the marker; and to eliminate the proportion of interfering pulses or harmonic wave forms.

SUMMARY OF THE INVENTION

According to the invention there is provided a method for producing electrical reference pulses in response to the rotation of any rotating body by sensing a marker attached to such body in a feedback free manner and controlling such reference pulses in response to the center of the pulses sensed from said rotating body. In a preferred embodiment of the present method, the electrical reference pulses is produced in response to the maximum of the pulse amplitudes sensed from said rotating body. Said sensed pulses will here after be referred to as the source pulses. The invention further teaches to control the production of the electrical reference pulses automatically in response to the maximum amplitude of the source pulses and in response to the center of the source pulses.

The control of the reference pulse production in response to the maximum amplitude of the source pulses is especially suitable for avoiding the influence of interfering pulses or harmonic wave forms.

With regard to the control of the reference pulse production in response to the center of the source pulses, the invention achieves the advantage that the production is now independent of the revolution per minute of the rotating body as well as independent of the shape or the position of the marker to be scanned or sensed. Thus, according to the invention, an exact reference pulse will be produced regardless whether the marker itself is narrow or wide. It is considered to be a special advantage that now even wide markers may be employed or that the sensing may be accomplished only in a tangential manner relative to the rotating body.

Where the production of the reference pulse is controlled by the center of the source pulse as well as by the maximum amplitude of the source pulse, the above outlined advantages are achieved in combination. Thus, interfering pulses or harmonic waves are substantially eliminated and the reference pulses are independent of the revolution per minute and of the shape of the marker. Furthermore, the quality of the electrical or electromagnetic sensing means also does not influence the exact reproducibility of the transmitted reference value.

A preferred circuit arrangement according to the invention for controlling the production of a reference pulse in response to the center of source pulses comprises an integrator circuit to which the source pulses are applied through a rectifier, the integrator is connected to a storage capacitor to which the voltage appearing at the output of the integrator is applied under the control of a timing circuit. Thereafter, the integrator is reset whereby the voltage at its output is erased. Thereafter, a portion of the voltage stored in such storage capacitor is compared in a comparator with a voltage appearing at the output of the integrator as the result of the next source pulse.

An embodiment of the just described circuit arrangement comprises as a timer a frequency divider which controls switching means and two integrator circuits in such a manner that the switching means supply the source pulses through a respective rectifier in an alternating manner. The voltage values which appear at the outputs of the respective integrator circuits are shifted relative to each other with respect to time. These shifted voltages are supplied to a comparator which is connected to the integrator circuits also through switches operable in response to said frequency divider in such a manner that a portion of the voltage value which preceeds in time is compared with the next following voltage value prior to its quenching or erasure.

A still further embodiment according to the invention for controlling the transmittal of a reference pulse in response to the center of a source pulse comprises a gate circuit which is opened at the beginning or by the leading edge of a source pulse. The gate is connected to a pulse generator which produces counting pulses. The output of the gate is connected to a digital counter which receives said counting pulses. A digital storage device is connected to the output of the counter. The instantaneous count of the counter at the trailing edge of a source pulse is produced in response to such trailing edge to the digital storage. Simultaneously, that is at the trailing edge of the source pulse the content of the digital counter is erased or the counter is reset and a portion of the value stored in the digital storage device is then compared in a comparator which the counting pulses which are counted in response to the leading edge of the next source pulse. The reference pulse is then produced in response to equality between the compared values. This particular circuit arrangement employing digital circuit elements has several advantages. Especially it permits achieving a compact structure and in addition it is possible to produce and transmit the reference pulses with any desired degree of accuracy.

According to the invention, in the just described circuit arrangement, the digital storage device may be replaced by a second digital counter which is controlled or triggered by the next following source pulse and which counts in a reverse direction. By this feature, it is achieved that the reference pulse is produced or delivered in response to a zero count. Stated differently, the comparator circuit is reduced to the function of ascertaining a zero count. Preferably, the digital counter and the digital storage device operate in a dual or binary code. The binary coding has the advantage that dividing the number of counting pulses by two is simply achieved by shifting the stored value by one position or digit.

A circuit arrangement for controlling the reference pulse automatically in response to the maximum amplitude value of the source pulse comprises, according to the invention, a comparator arrangement having two inputs. An input circuit connected to one input of the comparator device comprises a capacitor and a diode whereby a source pulse peak value stored in the capacitor is supplied to said one comparator input in series or in sequence with the entire source pulse. An adjustable potentiometer is connected to the other input of the comparator whereby a fixed adjusted voltage value is supplied to said other input. The comparator device has a given switching or circuit characteristic and the reference pulse appears at the output of the comparator device as a function of said characteristic. The just described embodiment has the advantage that the output reference pulse is free of interfering influences such as harmonic waves of the source pulses. Another advantage of this particular circuit arrangement is seen in that interfering voltages are eliminated independently of the amplitude of the source pulse.

In a modified embodiment of the above described circuit arrangement according to the invention a portion of the peak value of the source pulse is supplied to one input of a comparator device by means of a potentiometer adjusted to a fixed position. The source pulse is further supplied directly or without any influence to the same input of the comparator device. The reference pulse then appears at the output of the comparator device as a function of the circuit characteristic of said comparator device and free of interfering influences. This circuit arrangement also has the advantage that the interfering voltages are eliminated or filtered out independently of the impulse amplitude of the source pulse.

According to the invention it has been achieved for the first time in connection with balancing techniques to produce and transmit definite reference pulses free of interfering pulses and without regard to the width and the arrangement to the marker to be sensed. This has been achieved, remarkably without regard of the position of the sensing device relative to the marker and independently of the aging or quality of the photoelectric or electromagnetic sensing means.

BRIEF DESCRIPTION OF THE DRAWINGS:

In order that the invention may be clearly understood, it will now be described, by way of example, with reference to the accompanying drawings; wherein.

Figure 1:
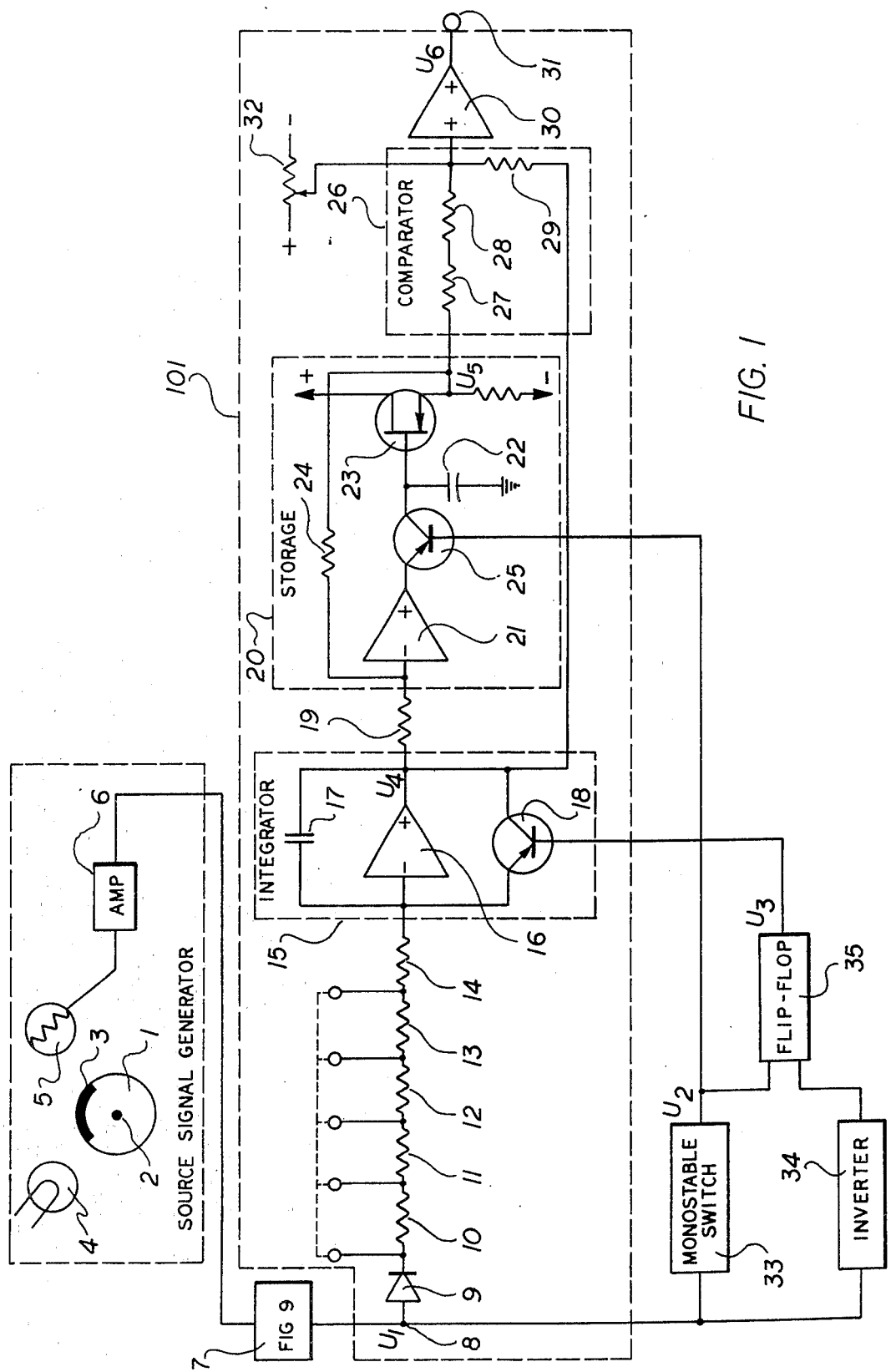
FIG. 1 is a preferred embodiment of a circuit arrangement for performing the method according to the invention, wherein the production of an electrical reference pulse is controlled by the center of the source pulse.

DESCRIPTION OF EXAMPLE EMBODIMENTS:

Referring to FIG. 1 a rotor 1 is rotatably supported on a shaft 2. A marker 3 to be sensed or scanned is attached to the rotor 1. The marker 3 may, for example, comprise a reflecting strip or it may be a marker having certain magnetic characteristics. For example, in the shown embodiment, the marker 3 is scanned by means of a lamp 4 and a photocell 5 which receives the light rays reflected by the lamp 4. However, the method according to the invention is not limited to using photoelectric sensing or scanning means. The present invention may be practiced by using any suitable scanning means.

Figure 2:
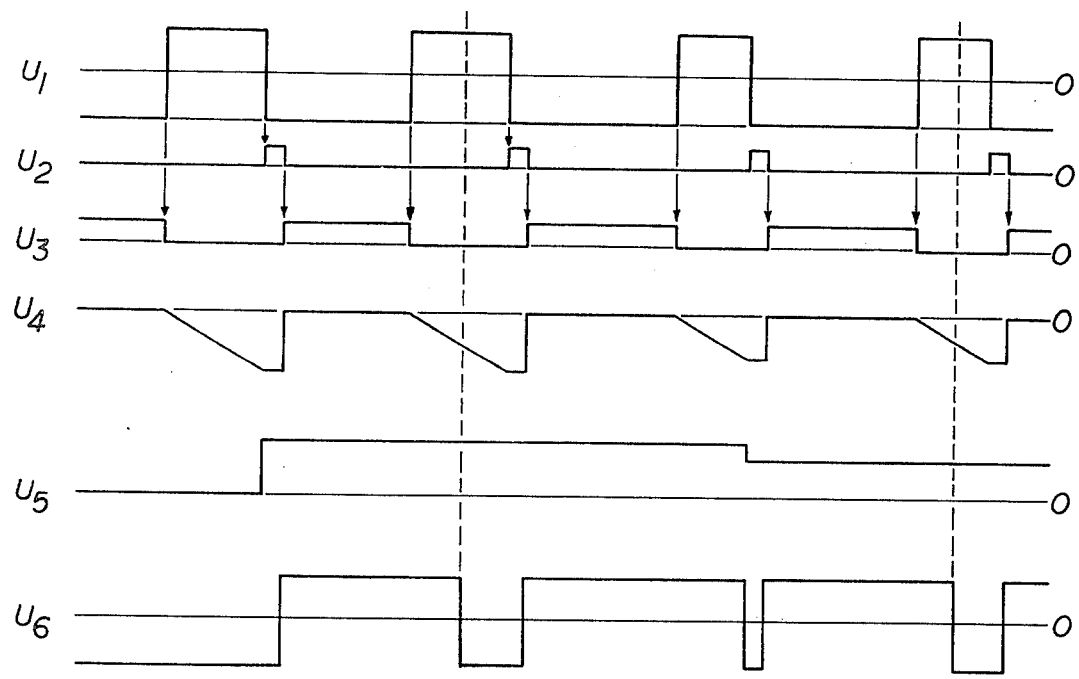
FIG. 2 illustrates the most important voltage wave forms of the circuit arrangement according to FIG. 1.

The scanning device 4, 5 is connected with its output to an input stage 6 which amplifies the scanned signals received from the scanning device and matches or attenuates such signal to the following circuit or circuit means 7. The pulses produced by the scanning device will be referred to as source pulses. The circuit arrangement 7 to be described in more detail below with reference to FIGS. 7 to 10 eliminates from the source pulse received from the scanning device and the input stage 6 interferring voltages or harmonic waves by producing a reference pulse which is automatically controlled in response to the maximum amplitude of the source pulse. As a result, an exact rectangular voltage wave form appears at the output 8 of the circuit arrangement 7. This rectangular voltage $U_1$ is shown in FIG. 2 and is supplied to a further circuit arrangement 101. The rectangular voltage $U_1$ is supplied to the input of an integrator circuit 15 through a rectifier 9 and a chain of resistors comprising a series of resistors 10 to 14 any one of which may be bridged to provide an adjustable impedance. The integrator 15 comprises an operational amplifier 16 which is provided with a negative feedback by means of a capacitor 17. The capacitor 17 may be short circuited by means of a switching transistor 18 for controlling the integrator 15. The output of the integrator 15 is connected to a storage device 20 by means of a resistor 19 for supplying the output voltage of the integrator to the storage. The storage 20 comprises operational amplifier 21, a storage capacitor 22 and a field effect transistor 23 as well as a resistor 24 and a switching transistor 25. The storage 20 is connected with its output to a comparator stage 26 comprising the resistors 27, 28 and 29. A portion of the voltage stored in the storage device 20 is compared in the comparator 26 with the output voltage of the integrator 15 resulting from the next source pulse applied to the integrator 15. When the two voltages are equal, an output pulse is supplied to the output terminal 31 through the amplifier 30. A zero deflection or original distortion of the amplifier 30 may be corrected by means of the potentiometer 32.

The circuit arrangement 101 is controlled by a timing device comprising a monostable switching means 33 which is connected with the output 8 of the circuit arrangement 7 thus receiving the output voltage $U_1$.

The timing means further comprise an inverter 34 also connected to the output 8 of the circuit arrangement 7. The monostable device 33 and the inverter 34 are connected to the two inputs of a flip-flop circuit 35. The flip-flop circuit 35 is connected to the control terminal, for example, to the base of the switching transistor 18 in the integrator 15. The output $U_2$ of the monostable flip-flop 33 is further connected to the switching transistor 25 of the storage device 20.

The circuit arrangement 101 for controlling the production of reference pulses in response to the center of the respective source pulse operates as follows. The precise rectangular voltage $U_1$ is applied to the monostable circuit 33, please see FIG. 2. At the end of each pulse of the voltage $U_1$ the monostable circuit 33 produces a pulse at its output which is shown as $U_2$ in FIG. 2. The output of the flip-flop circuit 35 produces a pulse sequence which begins when the pulse produced by the monostable circuit 33 ends. The pulse sequence in turn ends when the next pulse produced by the circuit arrangement 7 begins. This pulse sequence is shown as $U_3$ in FIG. 2. The rectangular voltage produced by the circuit 7 is further supplied in the circuit arrangement 101 of the integrator 15 through the rectifier 9 and the series of resistors 9 to 14. At the beginning of each pulse, the switching transistor 18 is blocked so that the capacitor 17 of the integrator 15 is charged linearly with respect to time by a negative voltage. The rectifier 9 prevents a further current flow with the trailing edge of the pulse.

Simultaneously with the foregoing, the switching transistor 25 of the storage 20 is made conductive by the pulse appearing at the output of the monostable circuit 33 whereby the voltage at the output of the integrator 15 is transmitted into the storage 20. By means of the operational amplifier 21 the stored voltage is reversed with regard to its polarity and it is assured that its magnitude corresponds exactly to the output voltage of the integrator 15. Upon completion of the pulse produced by the monostable circuit 33, the flip-flop circuit 35 switches the switching transistor 18 of the integrator 15 into its conducting state whereby the capacitor 17 of the integrator 15 discharged through the switching transistor 18. As a result, the content of the integrator is quenched or erased whereby an output voltage appears at the output of the integrator 15 which is shown as $U_4$ in FIGS. 1 and 2. Simultaneously, the switching transistor 25 is blocked or made non-conductive by the monostable circuit 33 so that the value which has been stored in the capacitor 22 remains in the capacitor. The wave form of the stored voltage is shown at $U_5$ in FIG. 2.

Simultaneously the output voltage of the integrator 15 is applied to the resistor 29 of the comparator stage 26 whereby it is compared with the stored voltage appearing across the resistors 27 and 28. Preferably, the resistors 27 28 and 29 are each of equal value. If the integrator voltage resulting from the next following source pulse reaches half of the value of the voltage across the resistors 27 and 28, an output pulse is applied to the output terminal 31 of the circuit arrangement 101 through the amplifier 30. The amplifier 30 operates without negative feedback as a switching amplifier and it flips to produce a negative output voltage if the voltage in the comparator stage 26 becomes zero. Since the voltage produced by the circuit arrangement 7 has an exact rectangular wave form, the output voltage $U_4$ of the integrator 15 rises strictly proportional to time in a linear fashion as seen at $U_4$ in FIG. 2. Accordingly, a negative going pulse is produced at the output terminal 31 exactly at the point of time when the center of the rectangular pulse produced by the circuit arrangement 7 is reached.

Subsequent to changing the pulse width of the voltage $U_1$ as shown in the right hand portion of FIG. 2, the reference pulse is again produced at the right point of time already with the second pulse of narrower width. In other words, the production of reference pulses at the correct point of time is restored immediately with the first pulse following the change of pulse width.

At the time when the content of the integrator 15 is erased through the flip-flop circuit 35 and the switching transistor 18 only the voltage of the storage 20 is present at the input of the switching amplifier 30. Therefore, the input voltage of the amplifier 30 is positive and the output pulse is terminated.

In order to facilitate the dimensioning of the circuit elements it is suitable to select the storage voltage in a range between +1 and +10 volts. This may be achieved by bridging a portion of the resistor chain 10 to 14 by short circuiting the respective terminals shown in FIG. 1 whereby the impedance value is respectively adjusted.

Figure 3:
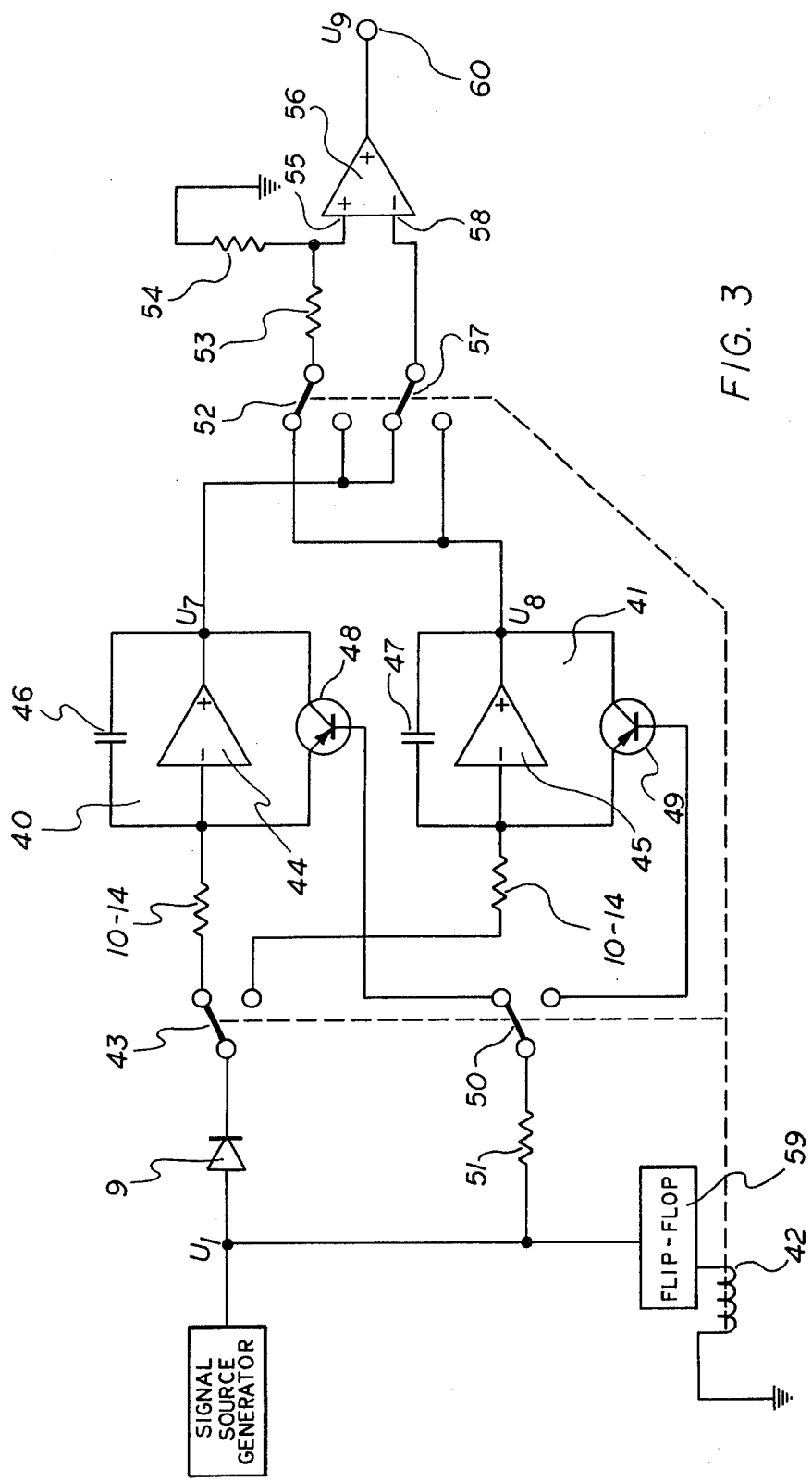
FIG. 3 illustrates a second circuit arrangement for performring the method according to the invention, wherein the production of the electrical reference pulses is also controlled by the center of the source pulse.

Another circuit arrangement for controlling the production of electrical reference pulses at the center of the source pulse is shown in FIG. 3 comprising essentially two circuit units 40 and 41 which are switched alternately to operate as an integrator or as a storage device. The rectangular pulses $U_1$ produced by the circuit arrangement 7 not shown in FIG. 3 are supplied through the rectifier 9 to the circuit units 40 and 41 in an alternative manner by means of a switch 43 performing a single pole double throw function and by means of the resistor chain 10 to 14 shown in a simplified manner in FIG. 3. The switch 43 is actuated by a relay 42 which in turn responds to a timing means such as a frequency divider flip-flop 59.

The circuit units 40 and 41 comprise each an operational amplifier 44, 45, storage capacitors 46, 47 connected in parallel to said operational amplifiers and switching transistors 48, 49 also connected in parallel to the operational amplifiers. The switching transistors 48, 49 are connected to the source signal generator to receive the voltage $U_1$ in an alternating manner through the switch 50 performing a single pole double throw function and through the resistor 51 connected in series with the switch 50.

In the position of the switches 43, 50, 52 and 57 as shown in FIG. 3, the circuit unit 41 operates as a signal storage. When the just mentioned switches take up their opposite position the circuit 41 operates as an integrator unit. In the position of the switches shown in FIG. 3, the output voltage of the storage unit 41 is supplied through the switch 52 and through a voltage divider 53, 54 to one input 55 of a switching amplifier 56. Preferably, the resistors 53 and 54 have the same value. The output value of the circuit unit 40 which operates in the shown position of the switches as an integrator is supplied through a switch 57 to a second input 58 of the switching amplifier 56. The switches 52 and 57 are also actuated simultaneously with the switches 43 and 50 by the relay 42 which, as mentioned, is energized through the flip-flop stage 59 actuated in response to the pulses $U_1$.

The operation of the circuit arrangement according to FIG. 3 will now be described with reference to FIG. 4. If the switches 43, 50, 52, and 57 are in the shown position, the circuit unit 40 operates as an integrator and the circuit unit 41 operates, as mentioned, as a storage. The voltage in the storage capacitor 41 rises thus in a linear fashion during the duration of the pulse produced by the circuit arrangement 7 while the switching transistor 48 is blocked for the duration of said pulse.

During this time the switching transistor 49 of the circuit unit 41 is also blocked. At the end of the pulse, that is at its trailing edge, the relay 43 is energized through the flip-flop 59 whereby the switches 43, 50, 52 and 57 are switched into their opposite positions so that the above described function of the circuit units 40 and 41 is reversed. The switching transistors 48 nd 49 are blocked when the base voltage is positive. In other words, the base is open. In the shown position of the switches, the output of the storage unit 41 is connected through the switch 52 and through the voltage divider 53 and 54 to the input 55 of the switching amplifier 56. Thus, a voltage corresponding to one half of the stored voltage is now present at the input 55 of the switching amplifier 56. The output voltage of the integrator 40 is now supplied through the switch 57 to the second input 58 of the switching amplifier 56. When the output voltage of the integrator 40 reaches the value of the voltage present at the input 55 of the switching amplifier 56, that is, a value corresponding to one half of the stored voltage the switching amplifier 56 produces a pulse at its output terminal 60. This pulse is shown at $U_9$ in FIG. 4.

At the end of the pulse $U_1$ the content of the circuit unit which operated as a storage during the duration of the pulse $U_1$ is erased or quenched. As a result, a zero voltage is present at this instance at the input 58 of the switching amplifier 56 whereby the output pulse is terminated.

Figure 4:
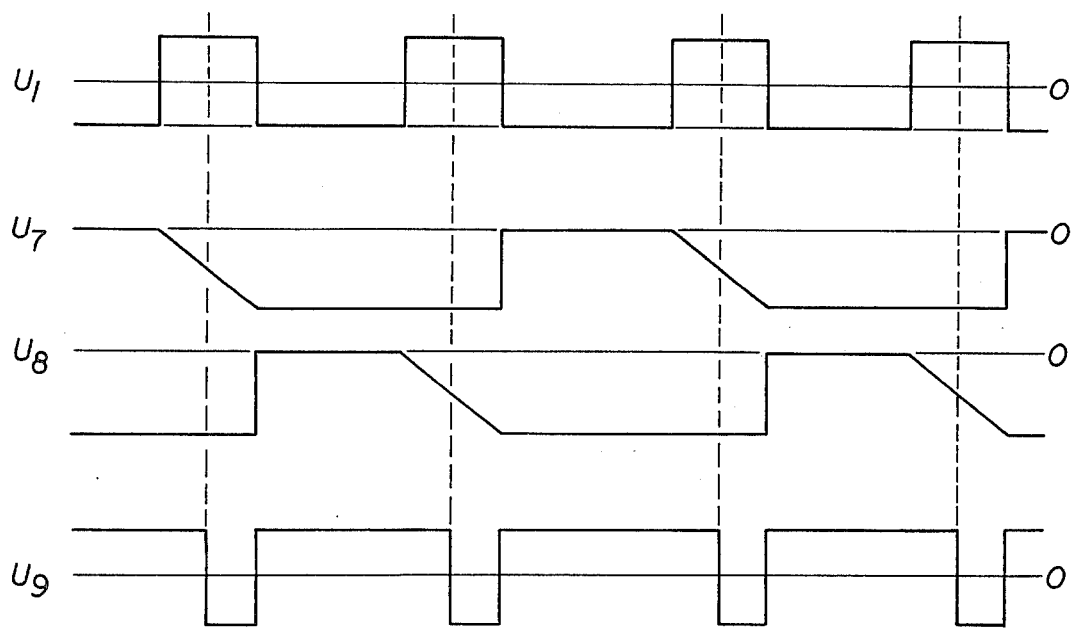
FIG. 4 shows the more important voltage curves of the circuit arrangement according to FIG. 3.

FIG. 4 illustrates voltage wave forms or pulses as they occur at the more important points in the circuit arrangement according to FIG. 3. $U_1$ illustrates the pulse sequence produced by the source generator including the circuit means 7. The pulse sequence $U_7$ and $U_8$ illustrates the output voltages of the integrators 40 and 41 whereas $U_9$ illustrates the reference pulse sequence appearing at the output 60 of the switching amplifier 56.

Figure 5:
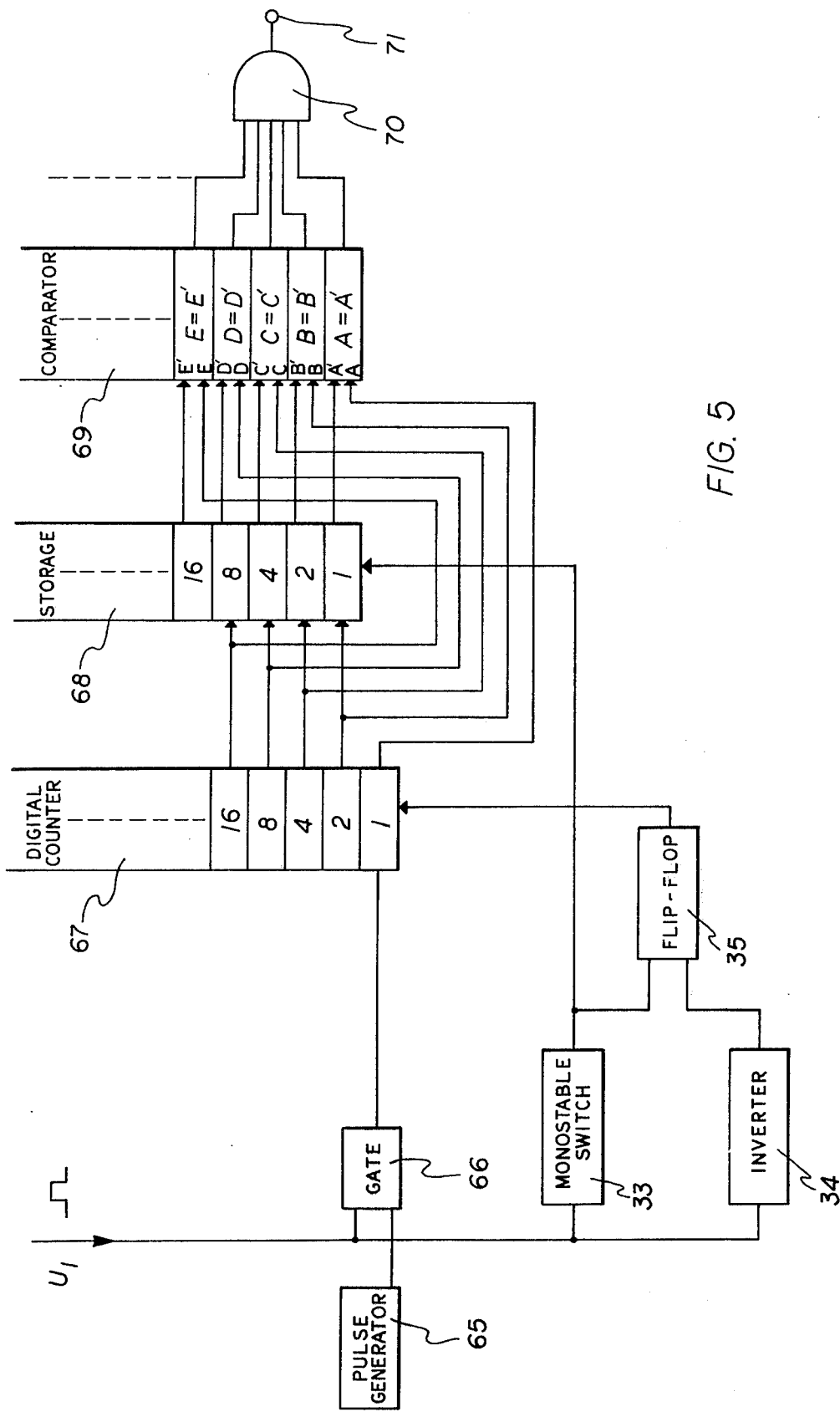
FIG. 5 shows a circuit arrangement for performing the method according to the invention wherein the production of an electrical reference pulse is controlled by the center of the source pulse by means of a digital counter and a digital storage device.

A third circuit arrangement for performing the method according to the invention comprises a pulse generator 65 as shown in FIG. 5 which produces counting pulses which are supplied through a gate 66 to a digital counter 67. The gate is opened with the leading edge of the first source pulse. The digital counter 67 operates preferably as a binary counter. The gate 66 remains open for the duration of the source pulse, that is, it is closed in response to the trailing edge of the source pulse. Further, the pulses produced by the circuit means 7 control a timing means as has been described above with reference to FIG. 1. The same timing means in employed in FIG. 5 and comprises the monostable circuit 33, an inverter 34 and a flip-flop circuit 35 controlled by the monostable circuit 33 and by the inverter 34. The function of this timing means is the same as that described with reference to FIG. 1. The gate 66 is closed at the occurrence of the trailing edge of a pulse $U_1$. Simultaneously the count of digital counter 67 is transferred to a digital storage 68 connected to the counter 67 and controlled by the timing means 33, 34 and 35. The count is reduced to one half by a one position shift.

The content of the digital counter 67 is erased and the content of the digital storage 68 is supplied to the comparator device 69. Furthermore, the comparator device 69 receives directly the content of the digital counter 66 which has been caused by the next succeeding source pulse produced by the circuit means 7. Th content of the digital counter rises linearly with the leading edge of such next succeeding source pulse in response to time. When the content of the counter 67 is exactly as large as the content of the storage 68 an output pulse is applied to the output terminal 71 by the comparing device 69 through the AND-gate 70. Thus, a pulse is generated at the output 71 of the circuit arrangement exactly at the center of the input or source pulse.

Figure 6:
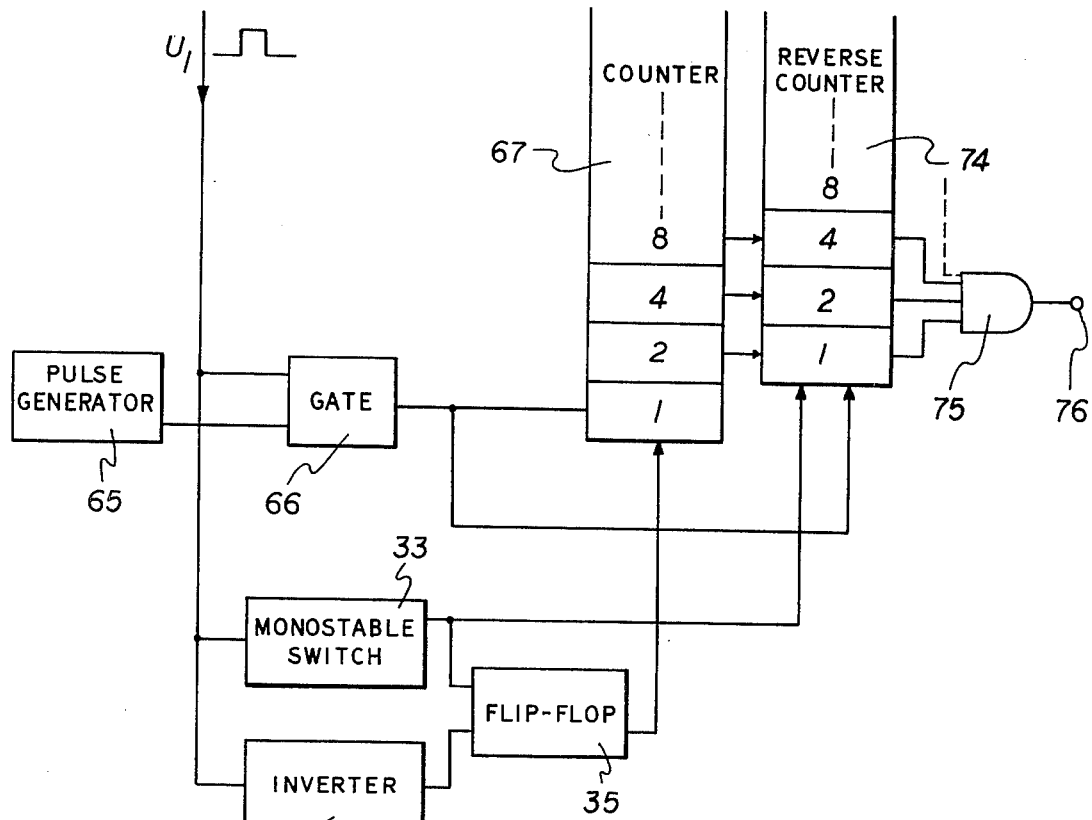
FIG. 6 illustrates a third embodiment for performing the present method wherein the production of the electrical reference pulse is also controlled by the center of the source pulse by means of two digital counters.

FIG. 6 illustrates a somewhat simplified modification of the circuit arrangement according to FIG. 5. The circuit arrangement according to FIG. 6 also comprises a pulse generator 65, a gate 66, a digital counter 67 and a timing device comprising again the monostable circuit 33, the inverter 34 and the flip-flop circuit 35. The gate 66 and the timing means 33, 34, 35, are again controlled by a source generator including the circuit means 7 and producing the pulses $U_1$. The counter 67 is connected with its output to a further digital counter 74 which counts in the reverse direction. During the duration of a source pulse produced by the circuit means 7, that is, between the leading and trailing edges of a source pulse, the pulses produced by the counting pulse generator 65 are transmitted through the gate 66 and into the digital counter 67. At the end of the first source pulse, the content of the digital counter 67 is transmitted into the digital counter 74 under the control of the timing means 33, 34, 35 whereby the transmitted value is diminished by one half of its total shifting the value by one position. Thereafter, the content of the counter 67 is erased and the counter is reset. With the leading edge of the next source pulse from the circuit means 7, the pulses produced by the counting pulse generator 65 are again permitted by the gate 66 to pass into the digital counter 67 whereby the digital counter 74 simultaneously counts in the reverse direction. When the digital counter 74 reaches the zero count, an output pulse is produced at the output terminal 76 through the AND-gate 75.

The circuit arrangement or circuit means 7 will now be described in more detail with reference to FIGS. 7 to 10. The source pulses produced by the scanning or sensing device 4, 5 will have superimposed thereon interfering voltages or harmonic waves so that the wave form will have a shape approximately corresponding to that shown at $U_{10}$ and $U_{14}$ in FIG. 8 and 10 respectively. In these wave forms only the highest peaks result from the sensing or scanning of the marker on the rotating body. However, the height or value of these peaks may vary between substantial limits. It is the purpose of the circuit arrangement 7 to produce an exact rectangular wave form from the pulses produced by the scanning and shown at $U_{10}$ or $U_{14}$. The circuit arrangement 7 accomplishes this by producing the reference pulse or rather its output pulse automatically in response to the maximum height or amplitude of the source pulses.

Figure 7:
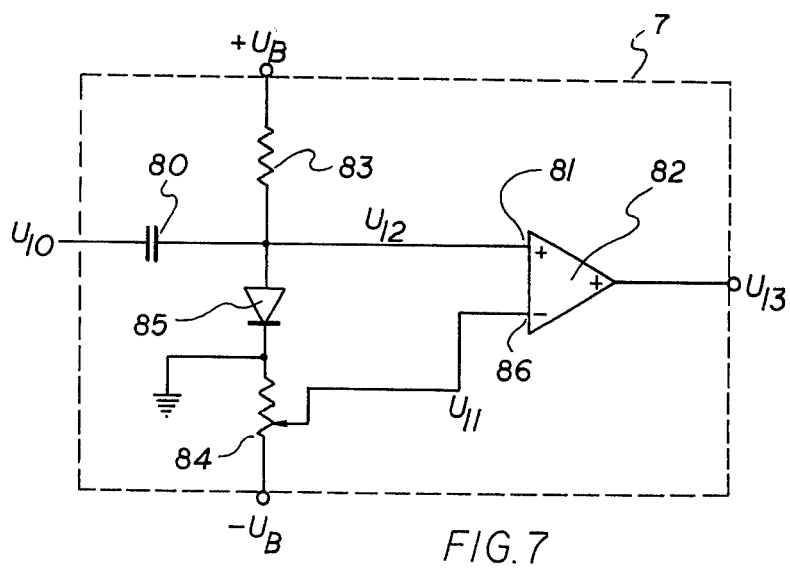
FIG. 7 shows a circuit arrangement for automatically controlling the production of the electrical reference pulse in response to the maximum value of the source pulse height or amplitude.

FIG. 7 illustrates a first embodiment of the circuit arrangement 7 wherein the voltage $U_{10}$ produced by the scanning means 4, 5 is applied through a capacitor 80 to the input 81 of a switching amplifier 82. The capacitor 80 is also connected through the diode 85 to ground or zero potential. Thus, the capacitor 80 is charged to the peak value of the voltage $U_{10}$. Accordingly, the input 81 of the switching amplifier 82 is supplied with a voltage $U_{12}$ which is negative.

Figure 8:
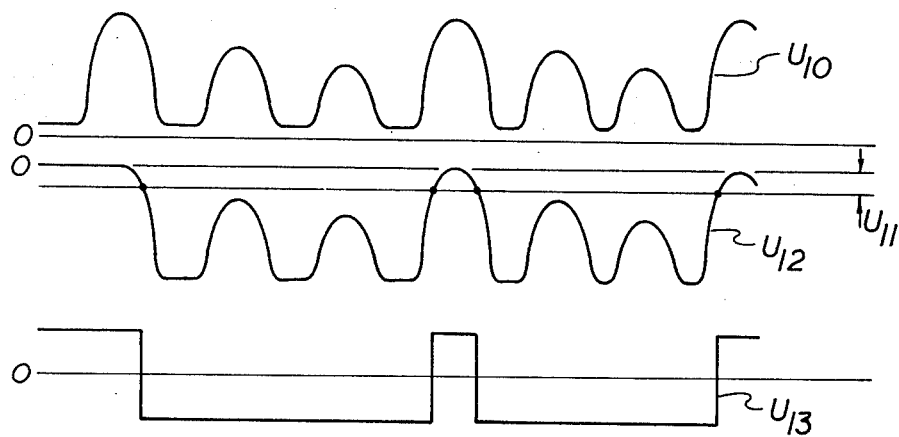
FIG. 8 illustrates the more important voltage characteristics or wave forms of the circuit arrangement according to FIG. 7.

To the second input 86 of the switching amplifier 82 there is applied a negative voltage $U_{11}$ which is tapped off from the potentiometer 84 connected to a negative voltage supply source. The voltages $U_{11}$ and $U_{12}$ applied to the inputs 86 and 81 respectively are shown in FIG. 8. The switching amplifier 82 changes its output signal if the difference between the two input voltages changes its polarity. At the output of the switching or computing amplifier 82 thus a signal is produced having the wave form $U_{13}$ illustrated in FIG. 8. The wave form $U_{13}$ has an exact rectangular shape and is suitable for the further use in the circuit arrangement 101 or in the other circuit arrangements described above. The resistor 83 makes it possible to slowly discharge the capacitor 80 so that its voltage may follow or correspond to a peak value of the source pulse which becomes gradually smaller.

Figure 9:
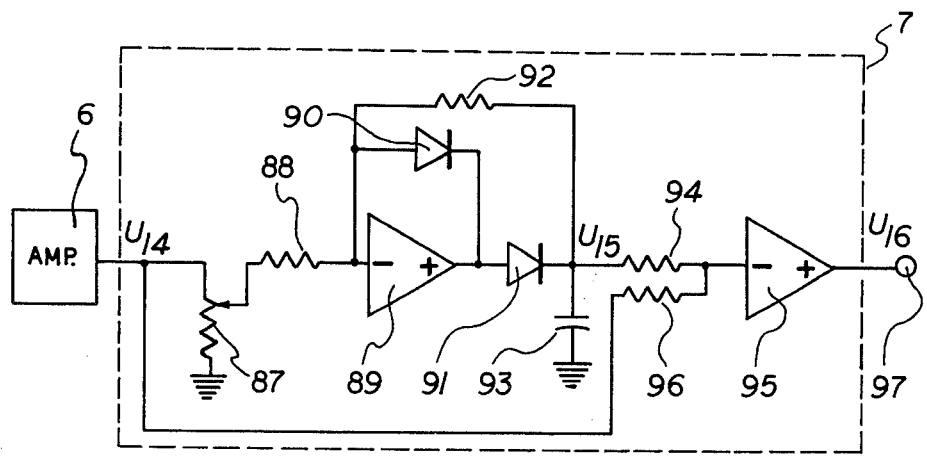
FIG. 9 shows a further circuit arrangement according to the invention for automatically controlling the production of the electrical reference pulses in response to the maximum amplitude value or height.
Figure 10:
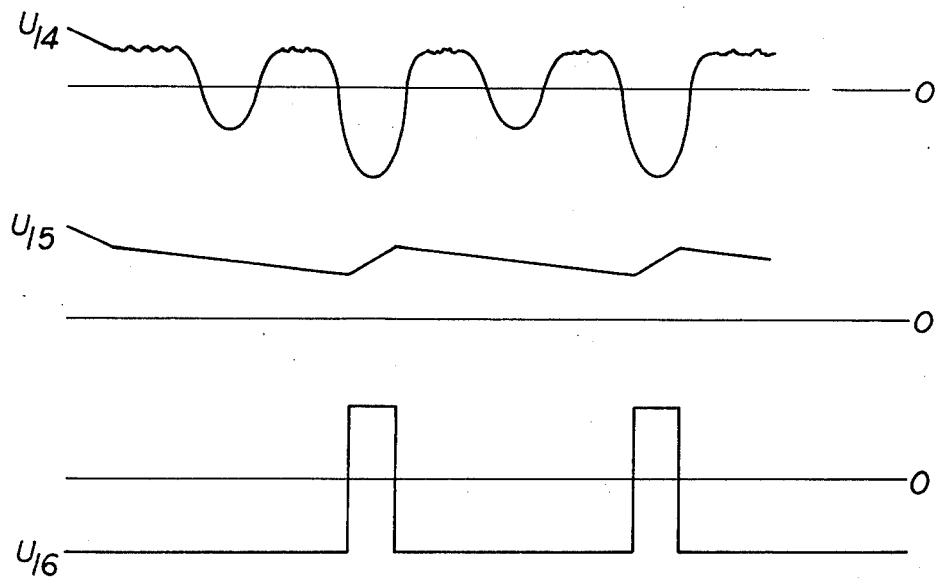
FIG. 10 illustrates the more important voltage wave forms in the circuit arrangement of FIG. 9.

Another embodiment of a circuit arrangement 7 is illustrated in FIG. 9 and its function will be explained with reference to FIG. 10. The source pulses $U_{14}$ produced by the sensing means 4, 5 and the input stage 6 is supplied through a potentiometer 87 and a resistor 88 to a computing amplifier 89 which is arranged as a peak value amplifier comprising the two diodes 90 and 91 as well as the resistor 92. The polarity reversed, negative peak voltage is stored in the capacitor 93. The wave form of the voltage stored in the capacitor 93 is shown in FIG. 10 at $U_{15}$. The voltage $U_{15}$ is supplied through a resistor 94 to the input of a switching amplifier 95. The same input of the switching amplifier 95 also receives the input voltage $U_{14}$ through a resistor 96 of equal value as the resistor 94. The output voltage of the switching amplifier 95 changes its polarity if the sum of the two voltages $U_{14}$ and $U_{15}$ changes its polarity. Thus, output reference voltage $U_{16}$ is produced in the respective wave form shown in FIG. 10 and corresponding to the source signal $U_1$ just as the reference signal $U_{13}$. With the aid of the potentiometer 87 it is possible to determine at which proportion of the peak value of the input voltage $U_{14}$ an output reference signal $U_{16}$ is to be produced whereby the capacitor 93 stores only a corresponding proportion or fraction of the peak voltage. Accordingly, the production or transmittal of a reference pulse is produced in response to the maximum amplitude or height of the source pulse.

Similar considerations apply to the circuit arrangement according to FIG. 7 where the voltage $U_{11}$ tapped off from the potentiometer 84 may be selected so that only the highest peaks of the input voltage produce the desired output reference pulses.

It should be restated here, that the term source generator as used above may either comprise the sensing means, 4, 5, the amplifier 6 and the circuit 7, or it may comprise only the means 4, 5 and 6. The latter will be the case where the claimed circuit will produce the reference pulses in response to peak values of the source pulses. In this instance, the source pulses are considered to appear at the output of the amplifier 6 and the reference pulses at the output of the circuit means 7. However, where the circuit means supply their output pulses to further circuit means, such as in FIG. 1, the source pulses are then considered to appear at the output of circuit means 7 and the reference pulses at the respective output terminals.

Although the invention has been described with reference to specific example embodiments, it is to be understood, that it is intended to cover all modifications and equivalents within the scope of the appended claims.

What is claimed is:

1. A method for producing timed reference signals responsive to the rotation of a body carrying a marker, comprising sensing said marker to produce a train of rectangular pulse signals, storing a value corresponding to the width of each pulse signal, integrating each pulse signal, and comparing said stored value corresponding to one pulse signal with th integrated signal corresponding to a succeeding pulse signal, thereby producing said timed reference signals at the centers of said rectangular pulse signals, whereby said timed reference signals indicate the angular displacement of said body.

2. The method of claim 1, comprising controlling the production of said reference signals in response to the maximum amplitude of said pulse signals.

3. The method of claim 1, wherein said step of producing said reference signals takes place at a time corresponding to the center of the pulse signals and at their maximum amplitude.

4. A method for producing timed reference signals for indicating the time of passage of a marker on a rotating body past a given fixed position with respect to the body, comprising sensing said marker to produce rectangular pulse signals, which occur at the time of passage of said marker past said position, storing a value corresponding to the width of each pulse signal, integrating each pulse signal, and comparing said stored value corresponding to one pulse signal with the integrated signal corresponding to a succeeding pulse signal, thereby producing said timed reference signals at the centers of said rectangular pulse signals, whereby the time of occurrence of said timed reference signals coincides with the instantaneous location of said marker at said position and provides a reference for the angular displacement of said body.

5. The method of claim 4, wherein said step of sensing comprises producing a rectangular pulse source signal having a leading edge corresponding to the passage of one edge of said marker past said position, and a trailing edge corresponding to the passage of the other edge of said marker past said position, the center of said rectangular pulse source signal being intermediate said leading end trailing edges.

* * * * *